United States Patent
Yamada et al.

(10) Patent No.: US 8,376,637 B2
(45) Date of Patent: Feb. 19, 2013

(54) PHOTORESIST COATING AND DEVELOPING APPARATUS, SUBSTRATE TRANSFER METHOD AND INTERFACE APPARATUS

(75) Inventors: Yoshiaki Yamada, Tokyo (JP); Yuichi Yamamoto, Tokyo (JP); Hitoshi Kosugi, Kumamoto (JP); Seiji Fujimoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 224 days.

(21) Appl. No.: 12/940,101

(22) Filed: Nov. 5, 2010

(65) Prior Publication Data

US 2011/0117492 A1    May 19, 2011

(30) Foreign Application Priority Data

Nov. 13, 2009  (JP) .................................. 2009-259872

(51) Int. Cl.
*G03D 5/00*    (2006.01)
(52) U.S. Cl. ........................................................ 396/611
(58) Field of Classification Search .................... 396/611
See application file for complete search history.

(56) References Cited

U.S. PATENT DOCUMENTS

| | | | |
|---|---|---|---|
| 6,266,125 B1 * | 7/2001 | Fukuda et al. | 355/27 |
| 2003/0012575 A1 * | 1/2003 | Ueda et al. | 396/611 |

FOREIGN PATENT DOCUMENTS

| | | |
|---|---|---|
| JP | 03-180023 A | 8/1991 |
| JP | 11-026370 A | 1/1999 |
| JP | 2008-034739 A | 2/2008 |

OTHER PUBLICATIONS

Japanese Office action for 2009-259872 dated Sep. 27, 2011.

* cited by examiner

*Primary Examiner* — Rodney Fuller
(74) *Attorney, Agent, or Firm* — Pearne & Gordon LLP

(57) ABSTRACT

A photoresist coating and developing apparatus 1 includes a photoresist film forming unit that forms a photoresist film on a substrate; a heat treatment unit that heats the substrate on which the photoresist film is formed by the photoresist film forming unit; a cooling unit that cools the substrate, on which the photoresist film is formed and which is heated by the heat treatment unit, to normal temperature; a heating unit 61 that heats the substrate, which is cooled to normal temperature by the cooling unit, to a predetermined temperature; a load-lock chamber L1 that unloads the substrate under depressurized atmosphere to expose the photoresist film; and a transfer device 62 that transfers the substrate from the heating unit 61 to the load-lock chamber L1.

28 Claims, 6 Drawing Sheets

PHOTORESIST COATING AND DEVELOPING APPARATUS, SUBSTRATE TRANSFER METHOD AND INTERFACE APPARATUS

CROSS-REFERENCE TO RELATED APPLICATION

This application claims the benefit of Japanese Patent Application No. 2009-259872 filed on Nov. 13, 2009, the entire disclosures of which are incorporated herein by reference.

FIELD OF THE INVENTION

The present disclosure relates to a photoresist coating and developing apparatus which forms a photoresist film on a substrate and develops the photoresist film exposed by an exposure apparatus. In particular, the present disclosure relates to a photoresist coating and developing apparatus suitable to be used with an exposure apparatus that exposes a photoresist film under vacuum and a substrate transfer method in this photoresist coating and developing apparatus.

BACKGROUND OF THE INVENTION

As a semiconductor device has been getting miniaturized, a line width is required to be about 20 nm or less. In order to get such a line width, development of an extreme ultraviolet light (hereinafter, referred to as "EUV light") exposure apparatus using an EUV light as an exposure light or an electron beam exposure apparatus using an electron beam as an exposure light has been progressing. In the EUV exposure apparatus, since the EUV light cannot penetrate the atmosphere, a photoresist film is exposed under vacuum. Further, in the electron beam exposure apparatus, since the electron beam is emitted from an electron gun, a photoresist film is exposed under vacuum. Meanwhile, since coating or developing photoresist on a wafer is carried out under an atmospheric pressure, a load-lock chamber serving as an interface unit is indispensable between the photoresist coating and developing apparatus and the exposure apparatus (see, for example, Patent Document 1).

Patent Document 1: Japanese Patent Laid-open Publication No. 2008-34739

However, when photoresist patterns each having a line width of about 20 nm or less are formed through an exposure process, alignment of patterns may be deviated due to thermal expansion of a wafer. Accordingly, temperature of the wafer under an exposure process needs to be maintained at a constant temperature. For this reason, the EUV exposure apparatus or the EB exposure apparatus is provided with a temperature control device and, thus, a temperature of the wafer can be controlled to be, for example, 23±0.02° C.

Further, in order to improve throughput, a temperature of a wafer needs to be quickly adjusted. Thus, the temperature of the wafer needs to be controlled in a photoresist coating and developing apparatus before the wafer is loaded into an exposure apparatus.

Considering these circumstances, the inventors of the present invention examined a control of the temperature of the wafer in the photoresist coating and developing apparatus. As a result of the examination, it has been found that even if the temperature of the wafer is precisely controlled in the photoresist coating and developing apparatus, the temperature of the wafer is greatly decreased due to adiabatic cooling occurring when depressurization is carried out in the load-lock chamber, and, thus, it is useless to control the temperature in the photoresist coating and developing apparatus.

Hereinafter, there will be explained how much a temperature of the wafer is decreased with reference to a result of an experiment conducted by the present inventors in a process of completion of the present disclosure. FIG. 1 shows a change in temperature of a wafer in a load-lock chamber. To be specific, in this experiment, a thermostat plate was provided in a load-lock chamber and a temperature of the thermostat plate was preset to be about 30° C. Then, a wafer equipped with a temperature measurement sensor (hereinafter, referred to as "test wafer") of which a temperature had been preset to be about 23° C. was provided in the load-lock chamber. With depressurization in the load-lock chamber, a change in the temperature of the test wafer with time was recorded. In this experiment, the test wafer was mounted on the hot plate at the time indicated by an arrow A1 of FIG. 1, the temperature of the test wafer was increased to about 28° C. Then, depressurization was carried out at the time indicated by an arrow A2 of FIG. 1.

It can be seen from FIG. 1 that if depressurization is carried out in the load-lock chamber, the temperature of the test wafer is sharply decreased. To be specific, the temperature of the test wafer was decreased by about 15° C. in about 40 seconds. Thereafter, the present inventors tried to control the temperature of the test wafer to be about 23° C. by using the hot plate but the temperature did not return to about 23° C. even at the time indicated by an arrow A3, i.e., about 4 minutes after the depressurization start time (the time indicated by the arrow A2).

Further, it can be seen that the temperature of the test wafer is varied in the range of ± about 0.4° C. in the surface at the loading time (indicated by the arrow A1) but it is greatly varied in the range of ± about 1° C. at the time of the lowest temperature (for reference, a plurality of curves in FIG. 1 shows a change in temperature at each measurement point in the test wafer but specific descriptions of the measurement points are omitted). It takes a long time to precisely control a temperature of the wafer after loading the wafer of which a temperature is non-uniformly changed into the exposure apparatus, which causes a decrease in the throughput.

In view of the foregoing problem, the present disclosure provides a photoresist coating and developing apparatus, a photoresist coating and developing method and an interface apparatus capable of reducing a change in temperature of a wafer when the wafer is transferred from the photoresist coating and developing apparatus to an exposure apparatus via a load-lock chamber.

BRIEF SUMMARY OF THE INVENTION

In accordance with a first aspect of the present disclosure, there is provided a photoresist coating and developing apparatus that forms a photoresist film on a substrate and develops the photoresist film. The photoresist coating and developing apparatus includes a photoresist film forming unit that forms a photoresist film on the substrate; a heat treatment unit that heats the substrate on which the photoresist film is formed by the photoresist film forming unit; a cooling unit that cools the substrate, on which the photoresist film is formed and which is heated by the heating unit, to normal temperature; a heating unit that heats the substrate, which is cooled to normal temperature by the cooling unit, to a predetermined temperature; a load-lock chamber positioned between an exposure apparatus that exposes the photoresist film under depressurized atmosphere and the photoresist coating and developing apparatus; and a transfer unit that transfers the substrate from the heating unit to the load-lock chamber.

In accordance with a second aspect of the present disclosure, there is provided an interface apparatus positioned between a photoresist coating and developing apparatus that forms a photoresist film on a substrate and develops the photoresist film and an exposure apparatus that exposes the photoresist film under depressurized atmosphere. The interface apparatus includes a heating unit that heats the substrate, on which the photoresist film is formed, heated, and cooled to normal temperature in the photoresist coating and developing apparatus, to a predetermined temperature; a load-lock chamber that loads the substrate heated to the predetermined temperature by the heating unit to the exposure apparatus under depressurized atmosphere; and a transfer unit that transfers the substrate from the heating unit to the load-lock chamber.

In accordance with a third aspect of the present disclosure, there is provided a substrate transfer method of transferring a substrate, on which a photoresist film is formed, from a photoresist coating and developing apparatus that forms the photoresist film on the substrate and develops the photoresist film to an exposure apparatus that exposes the photoresist film under depressurized atmosphere. The substrate transfer method includes heat-treating the substrate on which the photoresist film is formed by the photoresist coating and developing apparatus; cooling the substrate, on which the photoresist film is formed and which is heated in the heat-treating process, to normal temperature; heating the substrate, which is cooled to normal temperature in the cooling process, to a predetermined temperature by a heating unit; and transferring the substrate from the heating unit to a load-lock chamber positioned between the exposure apparatus which exposes the photoresist film under depressurized atmosphere and the photoresist coating and developing apparatus.

In accordance with an embodiment of the present disclosure, there are provided a photoresist coating and developing apparatus, a photoresist coating and developing method and an interface apparatus capable of reducing a change in temperature of a wafer when the wafer is transferred from the photoresist coating and developing apparatus to an exposure apparatus via a load-lock chamber.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
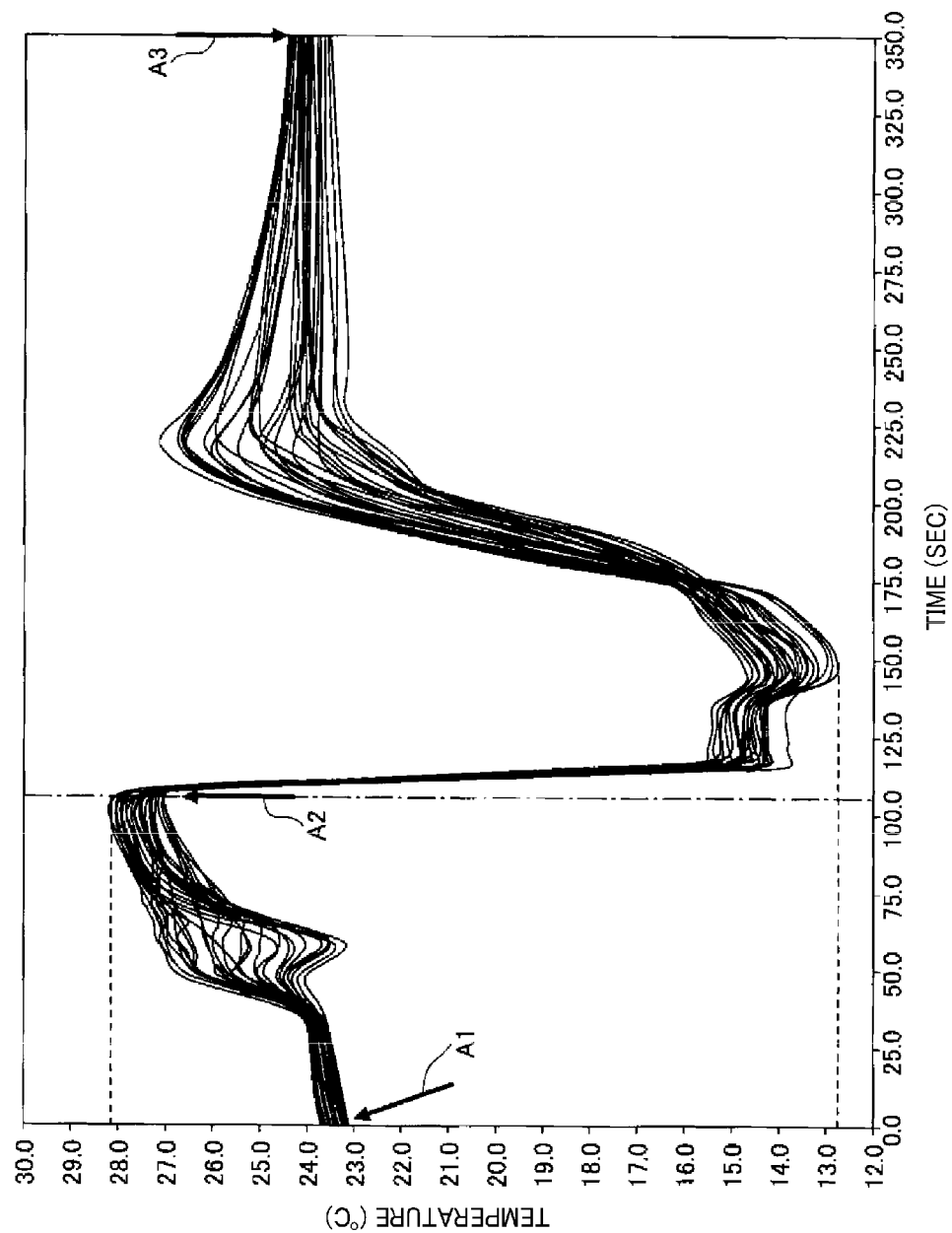
FIG. 1 is a graph showing an example of a change in temperature of a wafer in a load-lock chamber provided between a photoresist coating and developing apparatus and an exposure apparatus which exposes a photoresist film under vacuum.

Hereinafter, non-limiting embodiments of the present disclosure will be explained in detail with reference to accompanying drawings. In the whole drawings, same or corresponding elements or parts are assigned same or corresponding reference numerals and redundant description thereof may be omitted.

Figure 2:
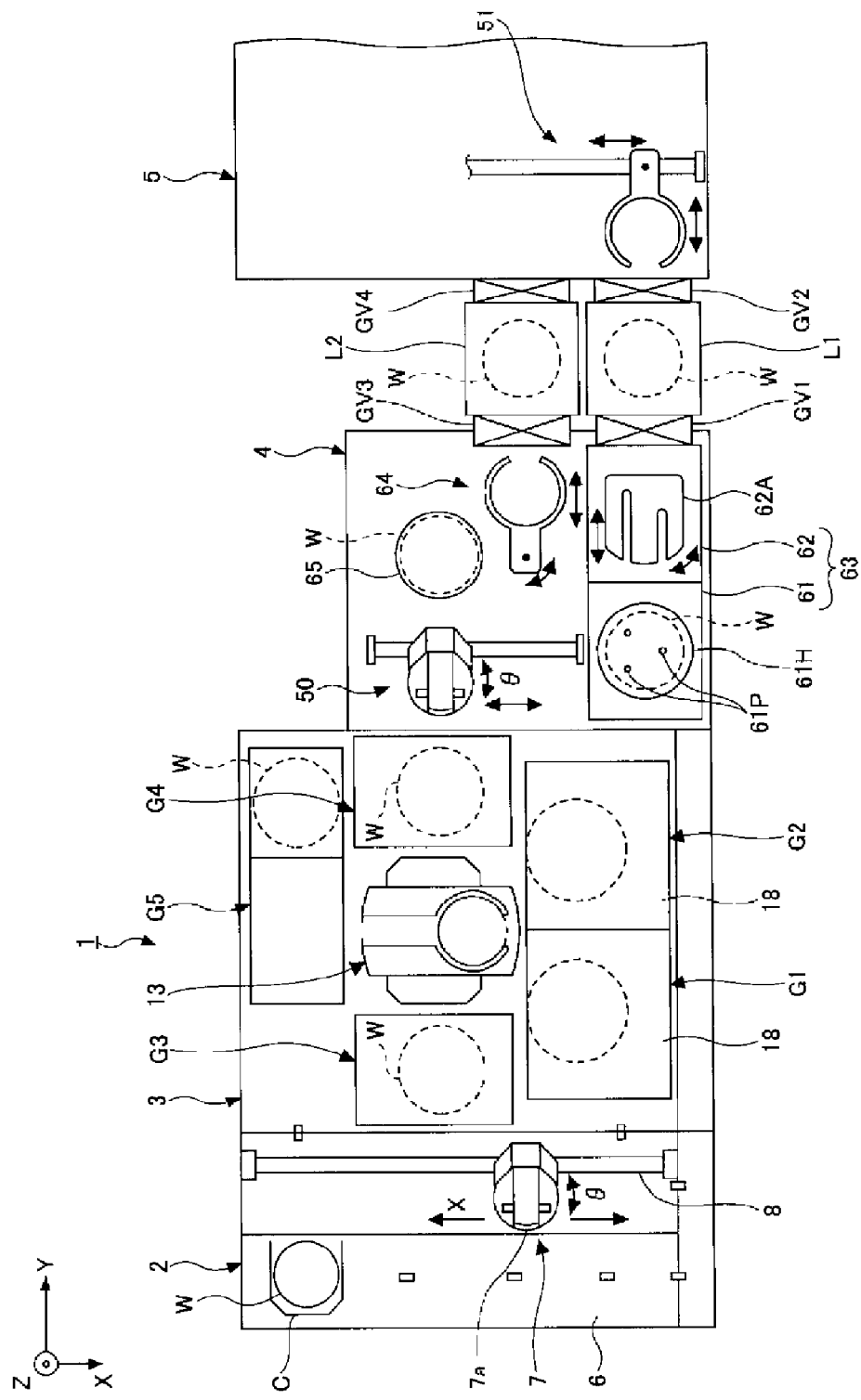
FIG. 2 is a plane view schematically showing a configuration of a photoresist coating and developing apparatus in accordance with an embodiment of the present disclosure.
Figure 3:
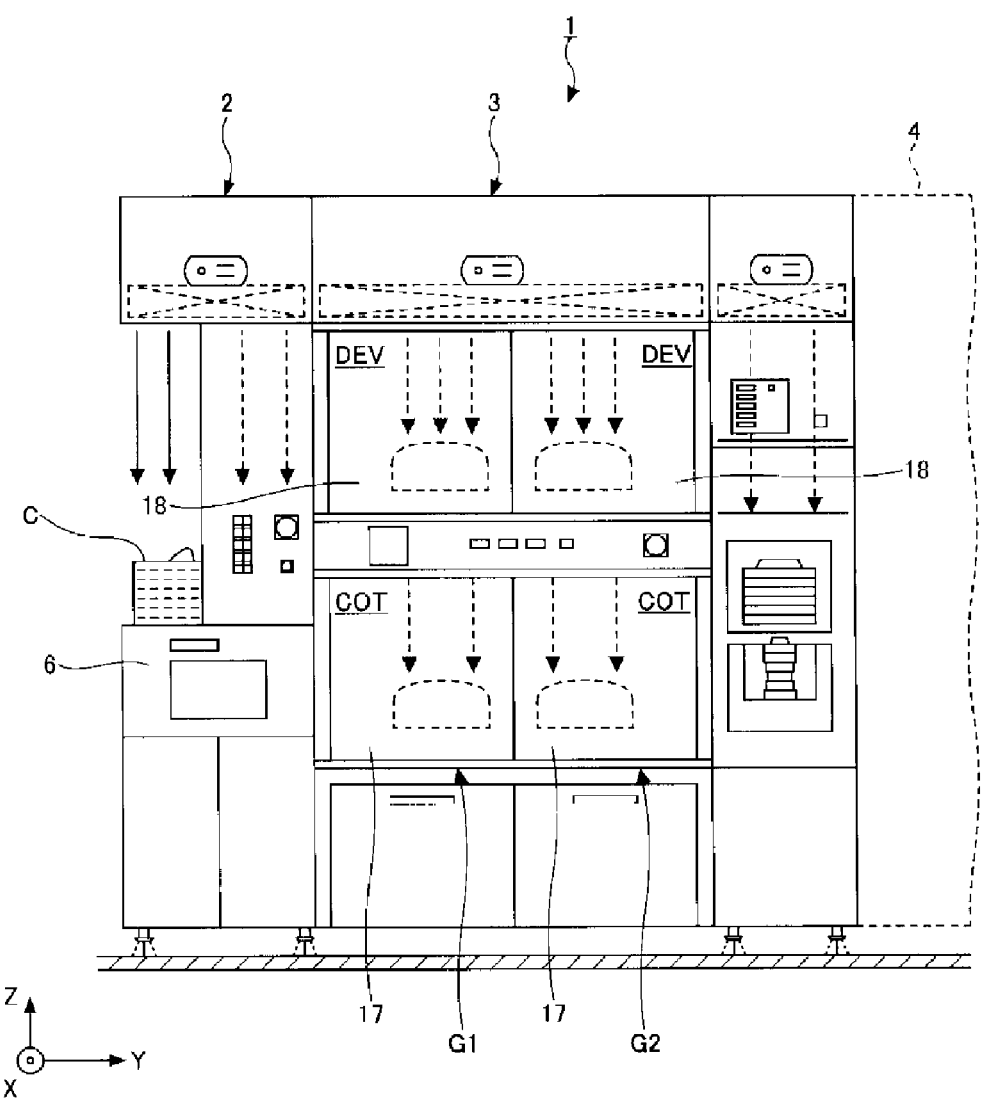
FIG. 3 is a front view schematically showing the photoresist coating and developing apparatus in accordance with the embodiment of the present disclosure.
Figure 4:
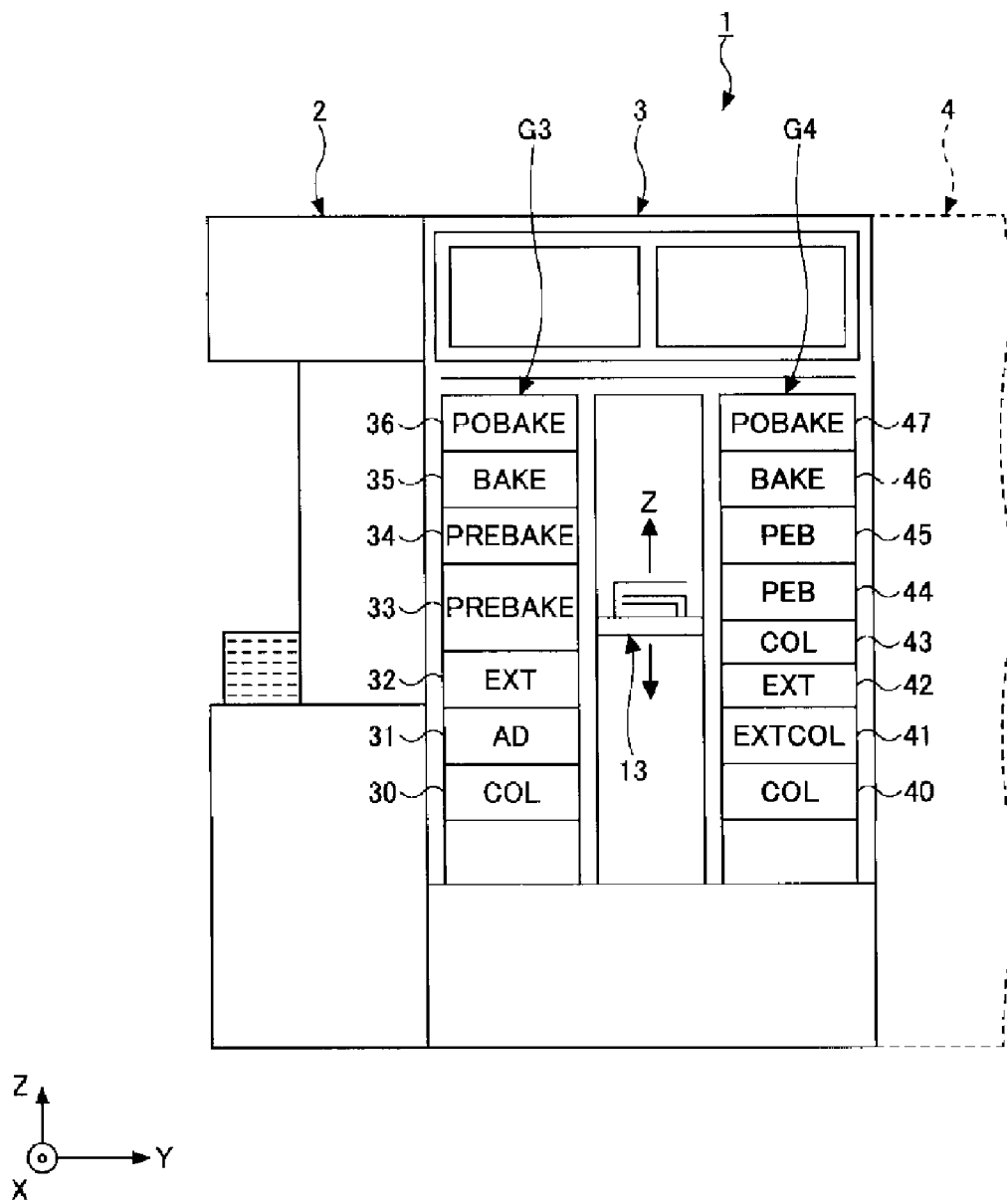
FIG. 4 is a rear view schematically showing the photoresist coating and developing apparatus in accordance with the embodiment of the present disclosure.

FIG. 2 is a plane view schematically showing a configuration of a photoresist coating and developing apparatus 1 in accordance with an embodiment of the present disclosure, FIG. 3 is a front view schematically showing the photoresist coating and developing apparatus 1, and FIG. 4 is a rear view schematically showing the photoresist coating and developing apparatus 1.

As depicted in FIG. 2, the photoresist coating and developing apparatus 1 includes a cassette station 2, a processing station 3, and an interface apparatus 4.

The cassette station 2 includes a mounting table 6 on which a cassette C accommodating, for example, about 25 sheets of wafers W is mounted; and a wafer transfer device 7 which takes the wafer W out of the cassette C mounted on the mounting table 6 and transfers the wafer W between the cassette C and the processing station 3. A plurality of (for example, four) cassettes C can be mounted on the mounting table 6 along an X-axis direction in the drawing (a longitudinal direction of the cassette station 2). The wafer transfer device 7 is positioned between the mounting table 6 of the cassette station 2 and the processing station 3 and can move in the X-axis direction along a transfer path 8. Further, the wafer transfer device 7 includes a wafer transfer arm 7a which can move in a Y-axis direction, a Z-axis direction (a vertical direction), and a θ direction (a rotation direction around a Z-axis). With this configuration, the wafer transfer device 7 can selectively access the cassette C mounted on the mounting table 6 and sequentially take the wafers W accommodated in multi-layers in the Z-axis direction out of the cassette C, and transfer the taken-out wafer W to a third processing unit set G3 (to be described later) of the processing station 3. Furthermore, desirably, the wafer transfer device 7 may have an alignment function to adjust a position of the wafer W.

In the processing station 3, a main transfer device 13 is provided at substantially the center thereof and four processing unit sets G1, G2, G3, and G4 are arranged around the main transfer device 13. These processing unit sets have various processing units stacked in multi-layers as described below. The first processing unit set G1 and the second processing unit set G2 are positioned in a plus (+) X-axis direction from the main transfer device 13. Further, the third processing unit set G3 and the fourth processing unit set G4 are positioned on both sides of the main transfer device 13 along the Y-axis direction. To be specific, the third processing unit set G3 is positioned to be adjacent to the cassette station 2 and the fourth processing unit set G4 is positioned to be adjacent to the interface apparatus 4. Furthermore, a fifth processing unit set G5 including various processing units stacked in multi-layers may be preliminarily provided in a minus (−) X-axis direction from the main transfer device 13.

The main transfer device 13 can load and unload the wafers W with respect to various kinds of processing units (to be described later) provided in these processing unit sets G1, G2, G3, G4, and G5.

Each of the first processing unit set G1 and the second processing unit set G2 may include, by way of example, as depicted in FIG. 3, a photoresist coating unit 17 that coats the wafer W with a photoresist solution and forms a photoresist film and a developing unit 18 positioned above the photoresist coating unit 17 and developing an exposed photoresist film.

The third processing unit set G3 may include, by way of example, as depicted in FIG. 4, a cooling unit 30 that cools the wafer W; an adhesion unit 31 that performs an adhesion process for increasing adhesiveness of the photoresist solution to the wafer W; an extension unit 32 that transits the wafer W; pre-baking units 33 and 34 that perform a baking process for evaporating a solvent from the photoresist solution coating the wafer W; a preliminary baking unit 35; and a post-baking unit 36 that performs a post-baking process for heating a developed photoresist film, in sequence from the bottom.

The fourth processing unit set G4 may include, by way of example, as depicted in FIG. 4, a cooling unit 40; an extension/cooling unit 41 that naturally cools the wafer W; an extension unit 42 that transits the wafer W between the main transfer device 13 and a wafer transfer device 50 (to be described later); a cooling unit 43; post-exposure baking units 44 and 45 that heat an exposed photoresist film; a preliminary baking unit 46; and a post-baking unit 47, in sequence from the bottom.

The number and positions of processing unit sets and the number, kinds and positions of processing units provided in each processing unit set may be arbitrarily selected depending on a kind of a process performed in the photoresist coating and developing apparatus 1 or a kind of a device to be manufactured.

Referring back to FIG. 2, the interface apparatus 4 may include the wafer transfer device 50 that loads and unloads the wafer W with respect to the fourth processing unit set G4; a buffer room 63 that maintains a temperature of the wafer W at a predetermined temperature and loads the wafer W to an exposure apparatus 5; two load-lock chambers L1 and L2 positioned between the photoresist coating and developing apparatus 1 and the exposure apparatus 5; a transfer arm 64 that takes the wafer W out of the load-lock chamber L2; and a buffer stage 65 on which the wafer W taken out of the load-lock chamber L2 by the transfer arm 64 is mounted.

The wafer transfer device 50 can move in the Z-axis direction and load and unload the wafer W with respect to the extension/cooling unit 41 and the extension unit 42 included in the fourth processing unit set G4. Further, the wafer transfer device 50 can move in the X-axis direction and rotate in the θ direction. Therefore, the wafer transfer device 50 can take the wafer W out of the fourth processing unit set G4 (mainly from the extension/cooling unit 41) and load the wafer W into a heating room 61 (to be described later) of the buffer room 63. Furthermore, the wafer transfer device 50 can access the buffer stage 65. Therefore, the wafer transfer device 50 can transfer the wafer W mounted on the buffer stage to the fourth processing unit set G4.

The buffer room 63 includes the heating room 61 and a transfer room 62. The heating room 61 heats the loaded wafer W to a predetermined temperature and maintains the temperature. To be specific, the heating room 61 includes a hot plate 61H on which the wafer W is mounted and which heats the mounted wafer W to a predetermined temperature and three lift pins 61P which can protrude and retract through through-holes formed in the hot plate 61H. The hot plate 61H may include a heater and temperature controller (not illustrated) therein and, thus, the hot plate 61H can heat the wafer W in the range, for example, from about 26° C. to about 100° C.

In the transfer room 62, there is provided a transfer arm 62A which loads the wafer W heated to the predetermined temperature in the heating room 61 to the load-lock chamber L1. The transfer arm 62A can be made of, for example, aluminum (Al). Further, the transfer arm 62A can be moved in the Y-axis direction and can be horizontally rotated about 180 degrees by a certain driving mechanism. Therefore, the transfer arm 62A can take the wafer W out of the heating room 61 and load the taken wafer W to the load-lock chamber L1. Furthermore, the transfer arm 62A has two slits, a long one and a short one. When the transfer arm 62A enters the heating room 61, even if the lift pins 61P protrude from the hot plate 61H, the lift pins 61P are allowed to be relatively inserted into the slits. Therefore, the transfer arm 62A can be positioned below the wafer W supported by front ends of the lift pins 61P. Then, the lift pins 61P retract down, so that the wafer W is delivered to the transfer arm 62A and loaded to the transfer room 62.

Moreover, the transfer arm 62A may include a fluid path through which a fluid flows and a temperature controller (not illustrated). The fluid maintained at a predetermined temperature may be supplied to the fluid path from a non-illustrated fluid circulator and a temperature of the transfer arm 62A may be maintained at a predetermined temperature. This temperature may be the same as, for example, a temperature of the hot plate 61H of the heating room 61. Since almost the entire surface of the transfer arm 62A except the two slits can support the wafer W and as described above, the transfer arm 62A can be maintained at the same temperature as the hot plate 61H of the heating room 61, it is possible to prevent a decrease in temperature of the wafer W when the wafer W is transferred from the heating room 61 to the load-lock chamber L1.

Further, the transfer room 62 may be provided with a temperature control unit (not illustrated) for controlling a temperature of its inner space. This temperature control unit may produce a downflow in the transfer room 62 by, for example, supplying temperature-controlled air cleaned by a preset filter from a blowing outlet formed in a ceiling of the transfer room 62 and evacuating the air through an evacuation port formed in a bottom so as to control the temperature in the transfer room 62. In this case, the temperature in the transfer room 62 may be the same as, for example, a temperature of the hot plate 61H of the heating room 61. Accordingly, a decrease in temperature of the wafer W can be effectively prevented.

Furthermore, the interface apparatus 4 is provided with a transfer arm 64 adjacent to a gate valve GV3 of the load-lock chamber L2. The transfer arm 64 is extensible and contractible in the Y-axis and X-axis directions and can be rotated around a base of the transfer arm 64. Therefore, the transfer arm 64 can enter the load-lock chamber L2, take the wafer W out of it, and mount the wafer W on the buffer stage 65.

The load-lock chamber L1 is connected with the interface apparatus 4 via a gate valve GV1 and connected with the exposure apparatus 5 via a gate valve GV2. Further, the load-lock chamber L1 is provided with a non-illustrated internal pressure control unit. The internal pressure control unit may include a roughing pump such as a rotary pump or a dry pump, a high vacuum pump such as a turbo-molecular pump, and a gas supply unit that supplies, for example, clean air or a nitrogen gas into the load-lock chamber L1 to maintain the load-lock chamber at an atmospheric pressure. Accordingly, the internal pressure of the load-lock chamber L1 can be maintained at either an atmospheric pressure or a depressurized pressure. The load-lock chamber L2 is connected with the interface apparatus 4 via a gate valve GV3 and connected with the exposure apparatus 5 via a gate valve GV4. Further, the load-lock chamber L2 may include an internal pressure control unit in the same manner as the load-lock chamber L1.

Installed in the load-lock chambers L1 and L2 may be support pins (not illustrated) vertically movable therein. The wafer W may be supported by the support pins within the load-lock chambers L1 and L2.

In the present embodiment, the load-lock chamber L1 may be used to transfer the wafer W from the photoresist coating and developing apparatus 1 to the exposure apparatus 5, whereas the load-lock chamber L2 may be used to transfer the wafer W from the exposure apparatus 5 to the photoresist coating and developing apparatus 1.

The exposure apparatus 5 may include a depressurization room (not illustrated) which can communicate with the load-lock chambers L1 and L2, and this depressurization room may be provided with a wafer transfer device 51 which is movable in the X-axis direction and extensible and contractible in the Y-axis direction. Therefore, the exposure apparatus 5 can take the wafer W out of the load-lock chamber L1 and load the wafer W into the load-lock chamber L2.

Hereinafter, an operation of the photoresist coating and developing apparatus 1 (i.e., a substrate transfer method in the photoresist coating and developing apparatus 1) in accordance with the present embodiment will be explained with reference to FIGS. 2 to 4.

A non-processed wafer W is taken out of the cassette C and transferred to the extension unit 32 (see FIG. 4) of the third processing unit set G3 by the wafer transfer device 7 (see FIG. 2). Then, the wafer W is loaded into the adhesion unit 31 of the third processing unit set G3 by the main transfer device 13 and the wafer W is coated with, for example, HMDS in order to increase adhesivity of photoresist solution to the wafer W. Subsequently, the wafer W is transferred to the cooling unit 30 and cooled to a predetermined temperature therein, and then transferred to the photoresist coating unit 17. In the photoresist coating unit 17, the wafer W is spin-coated with the photoresist solution and a photoresist film is formed thereon.

The wafer W on which the photoresist film is formed is transferred to the pre-baking unit 33 (see FIG. 4) by the main transfer device 13 and a pre-baking process is performed onto the wafer W. Thereafter, the wafer W is transferred to the extension/cooling unit 41 (see FIG. 4) by the main transfer device 13 and cooled to normal temperature. In this way, the wafer W is pre-baked at a controlled temperature and then cooled, and, thus, uniformity in wafer-to-wafer characteristics in the photoresist film can be obtained. Here, the normal temperature may be room temperature in a clean room in which the photoresist coating and developing apparatus 1 is installed or may be, for example, about 23±3° C.

Thereafter, the wafer W is taken out of the extension/cooling unit 41 and loaded into the heating room 61 of the buffer room 63 by the wafer transfer device 50 of the interface apparatus 4. In the heating room 61, the wafer W is received from the wafer transfer device 50 by the lift pins 61P of the hot plate 61H and when the lift pins 61P retract down, the wafer W is mounted on the hot plate 61H. The hot plate 61H is maintained at a temperature of, for example, about 50° C. and the wafer W is mounted on the hot plate 61H for a relatively short time, for example, about 5 seconds to about 20 seconds and heated to the temperature of the hot plate 61H.

Then, the wafer W is taken out of the heating room 61 and loaded into the load-lock chamber L1 by the transfer arm 62A of the transfer room 62. That is, the wafer W is lifted from the hot plate 61H by the lift pins 61P and received by the transfer arm 62A entering the underside of the wafer W. The transfer arm 62A receiving the wafer W is moved back to the transfer room 62 and horizontally rotated about 180 degrees. Subsequently, the gate valve GV1 of the load-lock chamber L1 is opened and the wafer W is loaded into the load-lock chamber L1 by the transfer arm 62A. In the load-lock chamber L1, the wafer W is received by the non-illustrated support pins from the transfer arm 62A and after the transfer arm 62A is moved out, the gate valve GV1 is closed. Thereafter, the inside of the load-lock chamber L1 is evacuated to a pressure of, for example, about $10^{-6}$ Torr ($1.33 \times 10^{-4}$ Pa) by the internal pressure control unit. In this case, since the air in the load-lock chamber L1 is cooled due to adiabatic expansion, the wafer W in the load-lock chamber L1 is also adiabatically cooled. However, the wafer W has been heated to about 50° C. in the heating room 61 and transferred to the load-lock chamber L1 from the transfer room 62 with prevention of a decrease in temperature of the wafer W. Therefore, even if the wafer W is adiabatically cooled, its temperature is not sharply decreased to a temperature of about 23° C.±0.02° C. or less required by the exposure apparatus 5.

When the pressure in the load-lock chamber L1 reaches a predetermined level, the gate valve GV2 is opened and the wafer W is loaded into the exposure apparatus 5 by the wafer transfer device 51 of the exposure apparatus 5. An exposure process using a photomask is performed onto the photoresist film under vacuum in the exposure apparatus 5, and then the wafer W is loaded into the pre-depressurized load-lock chamber L2 by the wafer transfer device 51 via the gate valve GV4.

Thereafter, when the gate valve GV4 is closed, the pressure in the load-lock chamber L2 is returned to the atmospheric level by an internal pressure control unit (not illustrated) provided in the load-lock chamber L2. Subsequently, the gate valve GV3 is opened and the wafer W is taken out of the load-lock chamber L2 and mounted on the buffer stage 65 by the transfer arm 64. Then, the wafer W on the buffer stage 65 is transferred by the wafer transfer device 50 to the extension unit 42 of the fourth processing unit set G4 in the processing station 3.

Subsequently, the wafer W is transferred to the post-exposure baking unit 44 by the main transfer device 13 so as to be post-exposure baked therein and transferred to the cooling unit 43 so as to be cooled therein. Thereafter, the wafer W is transferred to the developing unit 18 of the first processing unit set G1 or the second processing unit set G2 by the main transfer device 13 and the wafer W is developed therein. As a result, a patterned photoresist film (photoresist mask) is formed on the wafer W.

The developed wafer W is transferred to the post-baking unit 36 of the third processing unit set G3 by the main transfer device 13 and post-baked therein. Then, the wafer W is transferred to the cooling unit 30 of the third processing unit set G3 by the main transfer device 13 so as to be cooled therein and returned to the cassette C via the extension unit 32. In this way, a process including a series of photoresist coating, exposure, and developing processes onto the wafer W is ended.

Figure 5:
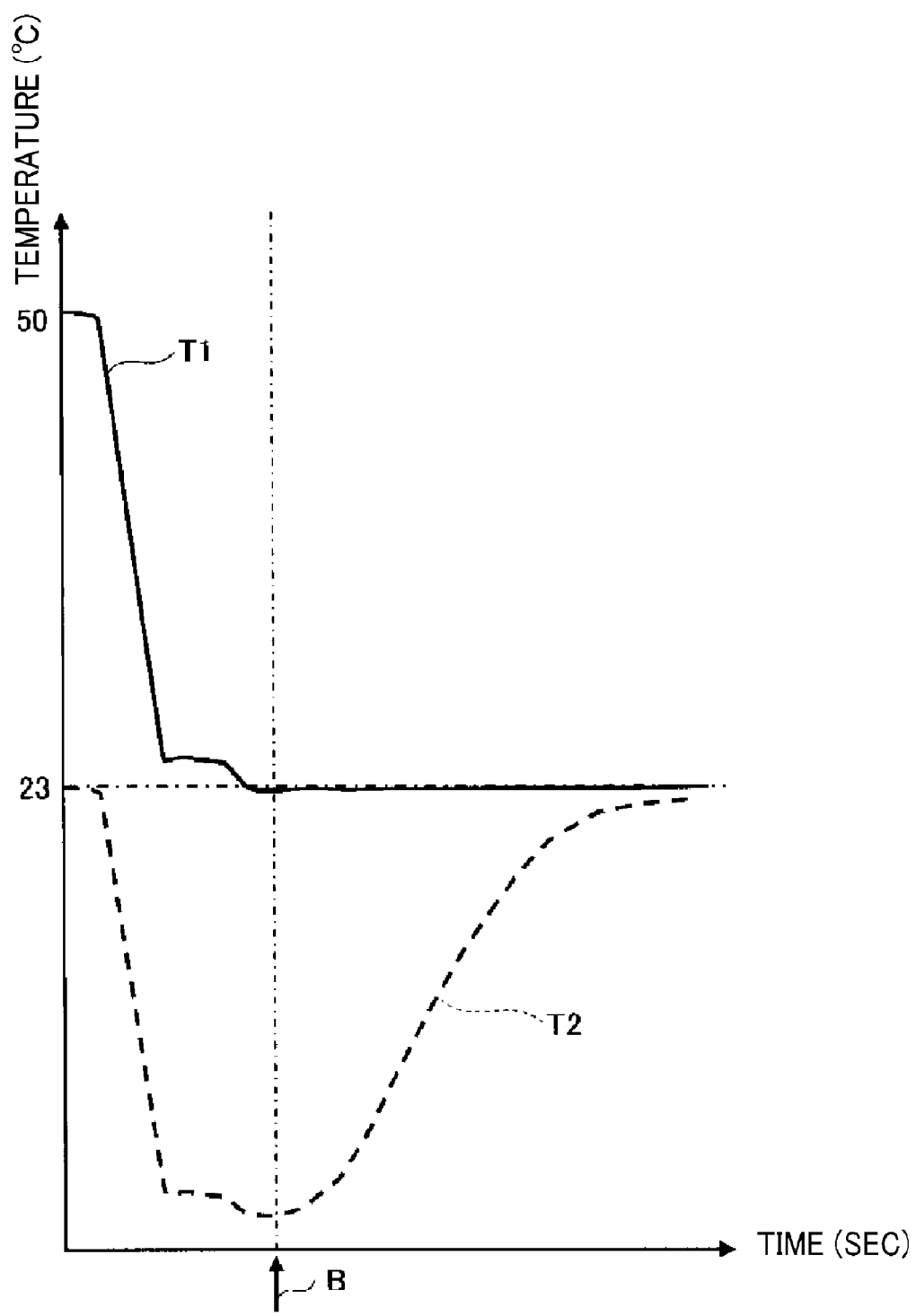
FIG. 5 is a view for explaining an effect of a substrate transfer method in the photoresist coating and developing apparatus in accordance with the embodiment of the present disclosure.

As described above, in the photoresist coating and developing apparatus and the substrate transfer method in the photoresist coating and developing apparatus in accordance with the embodiment of the present disclosure, the wafer W on which the photoresist film is formed, heat-treated, and cooled to normal temperature is heated to about 50° C. in the heating room 61 and loaded into the load-lock chamber L1 from the transfer room 62 with prevention of a decrease in temperature of the wafer W. When depressurization is started in the load-lock chamber L1, the temperature of the wafer W is sharply decreased as indicated by a mark T1 in FIG. 5 but can be reached to a temperature close to 23° C.±0.02° C. required by the exposure apparatus 5. Meanwhile, in a photoresist coating and developing apparatus without the heating room 61, if a pre-baked wafer is transferred into a load-lock chamber with a temperature maintained at about 23° C. and depressurization is carried out in the load-lock chamber, it takes a long time for the wafer W to return to a temperature of about 23° C. as indicated by a mark T2 in FIG. 5. Considering a throughput, by way of example, if the wafer W is transferred to the exposure apparatus 5 at the time indicated by an arrow B in FIG. 5, a temperature of the wafer W cannot be controlled in a short time prior to the exposure, which results in a throughput decrease in the exposure apparatus 5. However, in the photoresist coating and developing apparatus and the substrate transfer method in the photoresist coating and developing apparatus in accordance with the embodiment of the present disclosure, even if the wafer W is transferred to the exposure apparatus 5 at the time indicated by the arrow B in FIG. 5, a temperature of the wafer W is close to the temperature required by the exposure apparatus 5, and, thus, a temperature control can be performed in the exposure apparatus 5 in a short time. In particular, as explained with reference to FIG. 1, if a temperature of a wafer is decreased by about 15° C., the wafer needs about 4 minutes to return to a temperature of about 23° C. even if a temperature control is performed in a load-lock chamber with a hot plate. However, in accordance with the embodiment of the present disclosure, even if the temperature is decreased, the decreased temperature is close to about 23° C., and, thus, time (corresponding to about 200 seconds between the time when the temperature is decreased to about 13° C. to the time indicated by the arrow A3 in FIG. 1) for the wafer to return to a temperature of about 23° C. can be reduced and a throughput can be greatly improved.

In order to reduce adiabatic cooling, the inside of the load-lock chamber needs to be slowly evacuated. However, in order to perform a process at a throughput of, for example, about 200 sheets per hour, depressurization needs to be carried out in a short time. In this case, the wafer is greatly cooled, and, thus, it takes time to maintain the wafer at a temperature of about 23° C. Therefore, it becomes difficult to maintain a high throughput while pattern accuracy in an exposure apparatus is maintained. However, in the photoresist coating and developing apparatus in accordance with the present embodiment, a simple and effective method of increasing a temperature of the wafer W before the wafer W is loaded into the load-lock chamber L1 facilitates high pattern accuracy and a high throughput.

Further, in the photoresist coating and developing apparatus 1 in accordance with the embodiment of the present disclosure, the load-lock chamber L1 includes three support pins and the wafer W are supported by these support pins. Therefore, compared with a case, for example, where a wafer stage is installed in the load-lock chamber L1 and the wafer W is mounted thereon, it is possible to minimize an effect of a temperature change caused by adiabatic cooling. That is, if the wafer W is mounted on the wafer stage in the load-lock chamber, the wafer W loses heat to the wafer stage cooled by adiabatic cooling, and, thus, a temperature of the wafer W may be lower than a target temperature. However, since the wafer W is supported by the support pins in the load-lock chamber L1, such a problem may not occur.

Although the present disclosure has been explained with reference to the above-described embodiment, it is not limited thereto and can be changed and modified in various ways within a scope of the accompanying claims.

By way of example, in the above-description, a temperature of the hot plate 61H of the heating room 61 is set to about 50° C. but it is not limited thereto and can be appropriately adjusted. The amount of a decrease in temperature caused by adiabatic cooling largely varies depending on a depressurization rate determined by a pumping capacity of a pump connected with the load-lock chamber L1, an inner diameter of a pipe connecting the load-lock chamber L1 and the pump, a kind of a valve to be used (for example, an opening/closing valve or a flow rate control valve), and the like. Therefore, it is desirable to determine a set temperature of the hot plate 61H after conducting a preliminary experiment. Otherwise, as described below, it may be determined based on a result of a measurement on a temperature of the wafer W or a temperature distribution in the load-lock chamber L1 or in the exposure apparatus 5.

Desirably, the hot plate 61H of the heating room 61 may include divided heaters therein so as to control temperature uniformity in the surface of the wafer W as well as a (average) temperature of the wafer W. Hereinafter, such a hot plate will be explained with reference to FIG. 6.

Figure 6:
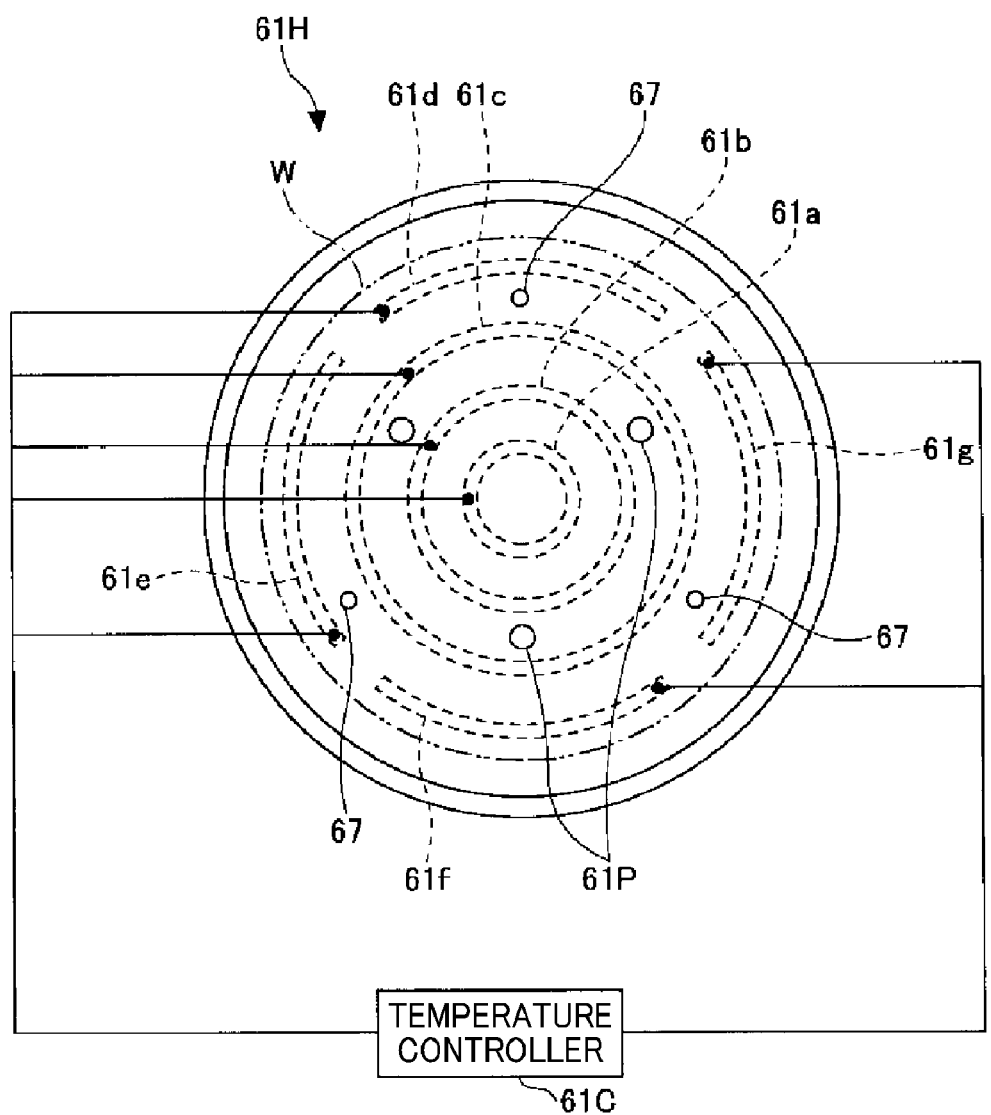
FIG. 6 is a top view showing a modification example of a hot plate provided in the photoresist coating and developing apparatus in accordance with the embodiment of the present disclosure.

The hot plate 61H in FIG. 6 includes three ring-shaped heaters 61a, 61b, and 61c which are concentrically arranged and on the outside thereof, circular arc-shaped heaters 61d, 61e, 61f, and 61g which are arranged to be spaced apart with a substantially constant angular distance. A temperature controller 61C (including a temperature sensor and a power supply) is connected with each of these heaters and the temperature controller 61C independently controls temperatures thereof. Further, the hot plate 61H is provided with three proximity pins 67 in addition to the above-described lift pins 61P. The wafer W put down on the hot plate 61H by the lift pins 61P is supported by the proximity pins 67, so that there is formed a gap having a certain distance between the hot plate 61H and the wafer W. With this configuration, the wafer W is heated by means of heat conduction via this gap by the hot plate 61H heated by the above-described heaters 61a to 61g and it is possible to prevent a temperature distribution caused by a contact error between the wafer W and the top surface of the hot plate 61H.

By way of example, with this hot plate 61H, it is possible to measure a temperature distribution in the surface of the hot plate 61H through a preliminary experiment using the above-described test wafer and it is possible to control the circular arc-shaped heaters 61d to 61g so as to uniformize the temperature distribution. Accordingly, the hot plate 61H can heat the wafer W uniformly.

In the heating room 61, the wafer W may be heated by a lamp instead of the hot plate 61H or the heating room 61 may be configured as a heating furnace.

In order to maintain the inside of the transfer room 62 at a predetermined temperature, a heating plate made of a resistance heating material or a heating lamp may be used without a supply of hot air. Further, the transfer arm 62A may be maintained at a predetermined temperature by an embedded heater without circulating the fluid.

The load-lock chamber L1 may be provided with a temperature measuring device to measure a temperature decrease caused by adiabatic cooling, and based on the measurement result, a temperature of the wafer W in the heating room 61 may be controlled. By way of example, a susceptor including thereon a silicon plate having therein a plurality of embedded thermocouples may be installed in the load-lock chamber L1, and as the temperature measuring device, the plurality of thermocouples may measure data on temperature in the surface. Further, the temperature measuring device may be infrared radiation thermometer. Furthermore, such measurement of a temperature may be carried out in the exposure apparatus 5 not in the load-lock chamber L1.

The transfer room 62 of the buffer room 63 includes the temperature control unit for controlling a temperature in the inner space of the transfer room 62 and a temperature control mechanism of the transfer arm 62A in order to transfer the wafer W to the load-lock chamber L1 without decreasing a temperature of the wafer W heated to a predetermined temperature in the heating room 61. However, the transfer room 62 does not need to include both of them and may include, by way of example, the temperature control unit only. Further, the transfer room 62 may include a heating lamp instead of them and it may be possible to prevent a decrease in temperature of a wafer by the heating lamp.

In another embodiment, the transfer room 62 may not include the temperature control unit for the inner space thereof, the temperature control mechanism of the transfer arm 62A, and the heating lamp. In this case, when a wafer is transferred from the heating room 61 to the load-lock chamber L1 via the transfer room 62, a temperature of the wafer is decreased, and, thus, it is desirable to set a temperature of the hot plate 61H of the heating room 61 so as to offset adiabatic cooling in the load-lock chamber L1 considering such a temperature decrease.

The transfer room 62 does not need to be airtightly sealed and may be configured as a transfer path partitioned by curtains made of a non-dusting material. Even in this case, temperature-controlled clean air can be supplied (in a downflow, for example) and the transfer arm 62A may control a temperature.

The interface apparatus 4 of the photoresist coating and developing apparatus 1 in accordance with the embodiment of the present disclosure may be configured as a single apparatus independent of the photoresist coating and developing apparatus 1. That is, the interface apparatus 4 may include a wafer transfer device 50 that receives a wafer W onto which a photoresist coating process is performed in the photoresist coating and developing apparatus 1; and the buffer room 63 that heats the wafer W transferred by the wafer transfer device 50 to a predetermined temperature and maintains the temperature and transfers the temperature-maintained wafer W to the load-lock chamber L1 to be loaded to the exposure apparatus 5. With this configuration of the interface apparatus, the existing photoresist coating and developing apparatus can be combined with an EUV exposure apparatus or an EB exposure apparatus, so that semiconductor devices having more fine patterns can be manufactured without a cost increase.

Although there has been explained a case of using a semiconductor wafer, the present disclosure is not limited to the semiconductor wafer and can be applied to a case of using a substrate for a flat panel display (FPD).

What is claimed is:

1. A photoresist coating and developing apparatus that forms a photoresist film on a substrate and develops the photoresist film, the apparatus comprising:
    a photoresist film forming unit that forms the photoresist film on the substrate;
    a first heating unit that heats the substrate on which the photoresist film has been formed by the photoresist film forming unit;
    a cooling unit that cools the substrate to normal temperature, the photoresist film having been formed on the substrate, the substrate having been heated by the first heating unit;
    a second heating unit that heats the substrate to a predetermined temperature prior to exposing the photoresist film, the substrate having been cooled to normal temperature by the cooling unit and having been transferred from the cooling unit;
    a first load-lock chamber that unloads the substrate under depressurized atmosphere to expose the photoresist film; and
    a first transfer unit that transfers the substrate from the second heating unit to the first load-lock chamber,
    wherein two pre-baking processes are performed on the substrate by the first heating unit and the second heating unit at different times.

2. The photoresist coating and developing apparatus of claim 1, wherein the first transfer unit includes a temperature control unit that maintains a temperature of the substrate transferred within the first transfer unit.

3. The photoresist coating and developing apparatus of claim 2, wherein the first load-lock chamber includes a temperature measurement unit that measures a temperature of the substrate loaded into the first load-lock chamber.

4. The photoresist coating and developing apparatus of claim 2,
    wherein the temperature control unit supplies temperature-controlled air to the first transfer unit to maintain the temperature of the substrate.

5. The photoresist coating and developing apparatus of claim 4,
    wherein the first transfer unit comprises a transfer arm that transfers the substrate, and
    the temperature control unit adjusts a temperature of the transfer arm to maintain the temperature of the substrate.

6. The photoresist coating and developing apparatus of claim 2,
    wherein the first transfer unit comprises a transfer arm that transfers the substrate, and
    the temperature control unit adjusts a temperature of the transfer arm to maintain the temperature of the substrate.

7. The photoresist coating and developing apparatus of claim 1, wherein the first load-lock chamber includes a temperature measurement unit that measures a temperature of the substrate loaded into the first load-lock chamber.

8. The photoresist coating and developing apparatus of claim 1, further comprising:
    a second load-lock chamber that transfers the substrate from an exposure apparatus to the photoresist coating and developing apparatus; and
    a second transfer unit that takes the substrate out of the second load-lock chamber.

9. The photoresist coating and developing apparatus of claim 8,
    wherein the first transfer unit is positioned between the second heating unit and the first load-lock chamber.

10. An interface apparatus that unloads a substrate on which a photoresist film has been formed in a photoresist coating and developing apparatus to expose the photoresist film and load the substrate after exposure into the photoresist coating and developing apparatus to develop the photoresist film, the interface apparatus comprising:
    a second heating unit that heats the substrate to a predetermined temperature prior to exposing the photoresist film, the photoresist film having been formed on the substrate, the substrate having been heated by a first heating unit, the substrate having been cooled to normal temperature in the photoresist coating and developing apparatus and having been transferred from the photoresist coating and developing apparatus;

a first load-lock chamber that unloads the substrate under depressurized atmosphere to expose the photoresist film; and a first transfer unit that transfers the substrate from the second heating unit to the load-lock chamber, wherein two pre-baking processes are performed on the substrate by the first heating unit and the second heating unit at different times.

11. The interface apparatus of claim 10, wherein the first transfer unit includes a temperature control unit that maintains a temperature of the substrate transferred within the first transfer unit.

12. The interface apparatus of claim 11, wherein the first load-lock chamber includes a temperature measurement unit that measures a temperature of the substrate loaded into the first load-lock chamber.

13. The interface apparatus of claim 11, wherein the temperature control unit supplies temperature-controlled air to the first transfer unit to maintain the temperature of the substrate.

14. The interface apparatus of claim 13, wherein the first transfer unit comprises a transfer arm that transfers the substrate, and the temperature control unit adjusts a temperature of the transfer arm to maintain the temperature of the substrate.

15. The interface apparatus of claim 11, wherein the first transfer unit comprises a transfer arm that transfers the substrate, and the temperature control unit adjusts a temperature of the transfer arm to maintain the temperature of the substrate.

16. The interface apparatus of claim 10, wherein the first load-lock chamber includes a temperature measurement unit that measures a temperature of the substrate loaded into the first load-lock chamber.

17. The interface apparatus of claim 10, further comprising:

a second load-lock chamber that transfers the substrate from an exposure apparatus to the photoresist coating and developing apparatus; and a second transfer unit that takes the substrate out of the second load-lock chamber.

18. The interface apparatus of claim 17, wherein the first transfer unit is positioned between the second heating unit and the first load-lock chamber.

19. A substrate transfer method of transferring a substrate, on which a photoresist film has been formed, from a photoresist coating and developing apparatus that forms the photoresist film on the substrate and develops the photoresist film to an exposure apparatus that exposes the photoresist film under depressurized atmosphere, the method comprising:

prior to cooling the photoresist film, heating the substrate with a first heating unit, the photoresist film having been formed on the substrate by the photoresist coating and developing apparatus;

cooling the substrate, on which the photoresist film has been formed and which has been heated in the heating process, to normal temperature;

prior to exposing the photoresist film, heating the substrate to a predetermined temperature with a second heating unit, the substrate having been cooled to normal temperature in the cooling process and having been transferred from the photoresist coating and developing apparatus; and transferring the substrate from the second heating unit to a first load-lock chamber positioned between the exposure apparatus and the photoresist coating and developing apparatus, wherein two pre-baking processes are performed on the substrate by the first heating unit and the second heating unit at different times.

20. The substrate transfer method of claim 19, wherein the transferring process includes maintaining a temperature of the substrate heated in the heating process.

21. The substrate transfer method of claim 20, further comprising:

measuring a temperature of the substrate loaded into the first load-lock chamber in the first load-lock chamber.

22. The substrate transfer method of claim 21, wherein the measuring process includes determining the predetermined temperature in the heating process based on the temperature of the substrate measured in the first load-lock chamber.

23. The substrate transfer method of claim 20, wherein the maintaining process includes supplying temperature-controlled air to a transfer unit to maintain the temperature of the substrate.

24. The substrate transfer method of claim 23, wherein the maintaining process includes adjusting a temperature of the transfer arm that transfers the substrate to maintain a temperature of the substrate.

25. The substrate transfer method of claim 20, wherein the maintaining process includes adjusting a temperature of the transfer arm that transfers the substrate to maintain a temperature of the substrate.

26. The substrate transfer method of claim 19, further comprising:

measuring a temperature of the substrate loaded into the first load-lock chamber in the first load-lock chamber.

27. The substrate transfer method of claim 26, wherein the measuring process includes determining the predetermined temperature in the heating process based on the temperature of the substrate measured in the first load-lock chamber.

28. The substrate transfer method of claim 19, further comprising:

taking the substrate out of a second load-lock chamber positioned between the exposure apparatus and the photoresist coating and developing apparatus.

* * * * *